United States Patent [19]

Itoh

[11] Patent Number: 4,506,443

[45] Date of Patent: Mar. 26, 1985

[54] METHOD OF MOUNTING ELECTRIC PART ONTO A SUBSTRATE

[75] Inventor: Tsukasa Itoh, Tokyo, Japan

[73] Assignee: Clarion Co., Ltd., Tokyo, Japan

[21] Appl. No.: 383,006

[22] Filed: May 28, 1982

[51] Int. Cl.³ .............................................. H05K 3/34
[52] U.S. Cl. .................................... 29/840; 228/180.1
[58] Field of Search .......................... 29/839, 832, 840;
174/68.5; 228/179, 175, 180 A, 180 R; 156/155, 313

[56] References Cited

U.S. PATENT DOCUMENTS

| | | | |
|---|---|---|---|
| 3,966,110 | 6/1976 | Boynton | 228/179 X |
| 4,139,881 | 2/1979 | Shimizu et al. | 228/180 R X |
| 4,215,025 | 7/1980 | Packer et al. | 228/180 R X |
| 4,226,659 | 10/1980 | Griffith et al. | 156/155 X |
| 4,312,692 | 1/1982 | Ikeda et al. | 29/832 X |
| 4,314,870 | 2/1982 | Ishida et al. | 156/155 X |

Primary Examiner—Mark Rosenbaum
Assistant Examiner—Carl J. Arbes
Attorney, Agent, or Firm—Russell E. Hattis

[57] ABSTRACT

A chip mounting substrate which comprises inserting holes formed in a substrate for inserting chips in, a sheet provided on the top surface of the substrate to cover the holes and having adhesivity on the inner surface covering the holes, and wiring pattern provided on the back surface of the substrate so as to be associated with electrode portions of the chips inserted in the inserting holes, so that after inserting the chips in the inserting holes to thereby temporarily adhere and fix them by the sheet, the electrode portion of each chip and the associated wiring pattern are soldered and connected together.

3 Claims, 3 Drawing Figures

METHOD OF MOUNTING ELECTRIC PART ONTO A SUBSTRATE

BACKGROUND OF THE INVENTION

This invention relates to a substrate on which electrical parts are mounted, and more particularly, to a substrate having such a structure that electrical parts mounted thereon do not protrude from the bottom plane thereof and a mounting method for mounting electrical parts on said substrate.

Generally in a miniaturized electronic devices, chips and other electric parts with lead wires are mounted together on one substrate. Conventional methods for mounting those parts have been such that after positioning the parts with lead wires on the substrate and clinching the lead wires on the back surface of the substrate, the lead wires are soldered and secured to the wiring pattern while chips, after being temporarily fixed on the back surface of the substrate by adhesive, are soldered and secured at electrode portions thereof together with the wiring pattern. This may be performed in the manner of mounting the chips first and the parts with lead wires later or in a manner mounting the parts with lead wires first and the chips later.

However, the former manner has the drawback that chips protruding from the back surface of the substrate disturb clinching and cutting work of the parts with lead wires on the back surface and are apt to be damaged or fall down. The latter also has the drawback that, although the lead wires can easily be clinched, since the lead wires already clinched along the back surface cause unevenness thereof, it is difficult to accurately spread adhesive for temporarily fixing the chips so that the electrode portions of the chips cannot be soldered well readily.

SUMMARY OF THE INVENTION

It is therefore an object of the present invention to overcome such conventional drawbacks as mentioned in the above, by using a temporary fixing sheet for temporarily fixing electric parts inserted in holes of a substrate.

According to the present invention, there is provided an electric part mounting substrate which comprises:

a substrate provided with at least inserting holes for inserting electric parts therein, and a sheet provided on the front surface of said substrate, said sheet being adhesive on one surface thereof contacting with the front surface of the substrate so as to serve to temporarily adhere and fix electric parts inserted in said inserting holes.

DETAILED DESCRIPTION OF THE PREFERRED EMBODIMENT

Figure 1:
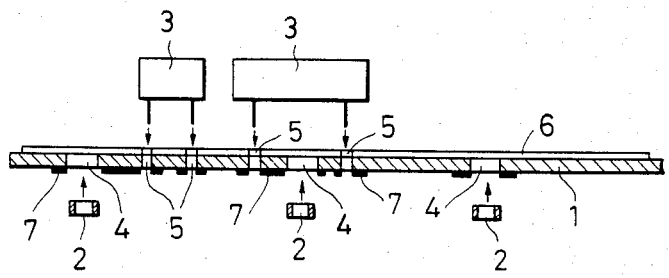
FIG. 1 shows an example of the substrate on which electric parts are not mounted yet.

The present invention will now be described in detail referring to the preferred embodiment illustrating in the drawings.

The reference numeral 1 refers to a substrate, 2 to a chip, 3 to an electric part with a lead wire, 4 to a chip hole formed in the substrate 1 for inserting the chip 2 therein, 5 to a lead wire hole formed in the substrate 1 for inserting the lead wire of the electric part 3 therein, and, 6 to a sheet laid on the front surface of the substrate 1 and having adhesive lower surface contacting with the substrate 1. The numeral 7 denotes wiring pattern provided on the back surface of the substrate 1 and the numeral 8 designates solder.

Figure 2:
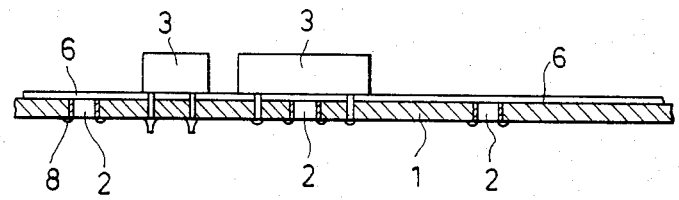
FIG. 2 shows the same example as FIG. 1 on which electric parts are mounted.
Figure 3:
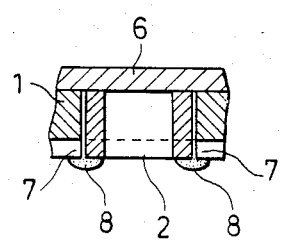
FIG. 3 is a partially enlarged view showing the structure for mounting chips.

First as shown in FIG. 1, the chip 2 is inserted in the chip hole 4 and is temporarily fixed to the lower surface of the sheet 6. Next, the electric part 3 is put on the top surface of the substrate 1 inserting the lead wire thereof in the lead wire hole 5. The back surface of the substrate 1 is then soaked in a solder bath so as to apply solder between the wiring pattern 7 and the electrode portion of the chip 2 as well as between the wiring pattern 7 and the lead wire of the electric part 3. A part of the lead wire which protrudes from the back surface of the substrate 1 is thereafter cut-off by a lead wire cutter to achieve the structure as shown in FIG. 2. FIG. 3 is an enlarged partial view illustrating the mounting structure of the chip 2.

It is possible to freely determine, without wondering drawbacks in the conventional art, which to first mount, the chip 2 or the electric part 3 with lead wire. Any material may be used as the sheet 6 provided it has adhesive on the surface thereof to cover the chip hole 4. For example, thermosetting adhesive sheet or pressure-sensitive sheet may be used. Thermosetting adhesive, particularly, permits the chip 2 to be easily and surely adhered to the sheet 6 by inserting the chip 2 in the chip hole 4 after warming it higher than the thermosetting temperature of said thermosetting adhesive.

As apparent from the description in the above, the present invention makes it easy to accurately position chips by means of chip holes. Further, since the chips are adhered to the sheet they can surely be soldered and secured together with the wiring pattern without dropping off of the substrate.

The present invention may also be applied to a structure for mounting, on a substrate, other electric parts without lead wires, such as chips.

I claim:

1. A method for mounting electric parts on a printed circuit board which comprises the steps of:

providing a printed circuit board having a conductive circuit pattern on one side thereof, part body-receiving holes extending completely through the board and which are adapted to receive electrical parts to be placed in the parts body-receiving holes from said one side of the board, the parts so mounted to provide exposed electrodes on and adjacent to said one side of the board, said board having applied over the opposite side of the board a permanent adhesive-containing sheet providing a tacky surface facing said parts body-receiving holes so that said holes are closed off at said opposite side of the board and are only open at said one side thereof;

placing the parts in said parts body-receiving holes from said one side of the board so that they are surrounded by the defining walls of said holes and are held in place by the tacky surface of said permanent sheet on said opposite side of the board and so that said electrodes are exposed to and are adjacent to said one side of the board; and soldering together on said one side of the board said conductive circuit pattern, and said exposed electrodes of the parts placed in said parts body-receiving holes.

2. A method for mounting electric parts on a printed circuit board which comprises the steps of:

providing a printed circuit board having a conductive circuit pattern on one side thereof, terminal pass-through holes to receive the projecting terminals of parts to be placed on the opposite side of the board, and parts body-receiving holes extending completely through the board and which are adapted to receive electrical parts to be placed in the parts body-receiving holes from said one side of the board, the parts so mounted to provide exposed electrodes on said one side of the board, said board having applied over said opposite side of the board a permanent adhesive-containing sheet providing a tacky surface facing said parts body-receiving holes so that said holes are closed off at said opposite side of the board and are only open at said one side thereof;

placing the parts with parallel, confronting projecting terminals on said opposite side of said board with the parallel terminals thereof pushed through said terminal pass-through holes of the board;

inserting the parts in said parts body-receiving holes from said one side of the board so that they are surrounded by the defining walls of said holes and are held in place by the tacky surface of said permanent sheet on said opposite side of the board and so that said electrodes are exposed to and are adjacent to said one side of the board; and soldering together on said one side of the board, said conductive circuit pattern, the projecting terminals of said parts with projecting terminals and said exposed electrodes of the parts placed in said parts body-receiving holes.

3. The method of claim 2 wherein said board is oriented so that the side of the board on which said permanent sheet is located is horizontal and at the top of the board, so that said parts with projecting terminals before soldering are initially placed on and are supported by the top of the board and said parts are supported solely by the tacky surface of said permanent sheet.

* * * * *